US012812910B2

(12) United States Patent
Qin et al.

(10) Patent No.: US 12,812,910 B2
(45) Date of Patent: Nov. 24, 2026

(54) STACKED DEVICE VIA TO POWER ELEMENT STRUCTURE

(71) Applicant: International Business Machines Corporation, Armonk, NY (US)

(72) Inventors: Liqiao Qin, Albany, NY (US); Nikhil Jain, Apple Valley, MN (US); Prabudhya Roy Chowdhury, Albany, NY (US); Sagarika Mukesh, Albany, NY (US); Tao Li, Slingerlands, NY (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 17/896,631

(22) Filed: Aug. 26, 2022

(65) Prior Publication Data

US 2024/0072146 A1 Feb. 29, 2024

(51) Int. Cl.
*H10D 30/67* (2025.01)
*H10W 20/41* (2026.01)

(52) U.S. Cl.
CPC ..... *H10D 30/6735* (2025.01); *H10D 30/6757* (2025.01); *H10W 20/427* (2026.01)

(58) Field of Classification Search
CPC ........................ H10D 30/6735; H10W 20/427
See application file for complete search history.

(56) References Cited

U.S. PATENT DOCUMENTS

| | | | |
|---|---|---|---|
| 5,025,304 A | 6/1991 | Reisman et al. | |
| 7,083,425 B2 | 8/2006 | Chong et al. | |
| 7,863,185 B2 | 1/2011 | Oh | |
| 8,803,292 B2 * | 8/2014 | Chen | H01L 23/485 257/773 |
| 8,912,661 B2 | 12/2014 | McGrath et al. | |
| 10,177,133 B2 * | 1/2019 | Young | H10D 84/013 |
| 10,192,819 B1 | 1/2019 | Chanemougame et al. | |
| 10,192,867 B1 | 1/2019 | Frougier et al. | |
| 10,510,622 B1 | 12/2019 | Frougier et al. | |
| 10,700,064 B1 * | 6/2020 | Zhang | B82Y 10/00 |
| 10,700,208 B2 * | 6/2020 | Chang | H10D 30/62 |
| 10,784,171 B2 | 9/2020 | Frougier et al. | |
| 10,790,172 B2 | 9/2020 | Ming et al. | |
| 2006/0131283 A1 | 6/2006 | Hall et al. | |

(Continued)

OTHER PUBLICATIONS

J. Ryckaert et al., "The Complementary FET (CFET) for CMOS scaling beyond N3," Symposium on VLSI Technology, 2018, pp. 141-142.

(Continued)

*Primary Examiner* — Jeff W Natalini
*Assistant Examiner* — Jacob Raul Marin
(74) *Attorney, Agent, or Firm* — Samuel Waldbaum; Ryan, Mason & Lewis, LLP

(57) ABSTRACT

A semiconductor device includes a first transistor including a first source/drain region, and a second transistor stacked on the first transistor. The second transistor includes a second source/drain region. The semiconductor device further includes a via structure disposed between a power element and the second source/drain region. The via structure includes a first via disposed on the power element, and a second via disposed on the first via, wherein the second via is angled with respect to the first via.

20 Claims, 13 Drawing Sheets

(56) References Cited

U.S. PATENT DOCUMENTS

| | | | | |
|---|---|---|---|---|
| 2016/0055972 | A1* | 2/2016 | Chen | H01G 4/236<br>361/321.1 |
| 2020/0294998 | A1 | 9/2020 | Lilak et al. | |
| 2020/0411436 | A1* | 12/2020 | Xie | H01L 21/02126 |

OTHER PUBLICATIONS

Oxford Instruments Plasma Technology, "Profile Control for Slanted Etching," https://www.azom.com/article.aspx?ArticleID=19498, Jul. 31, 2020, 6 pages.

* cited by examiner

100

100

STACKED DEVICE VIA TO POWER ELEMENT STRUCTURE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming a via to a power element structure for a stacked semiconductor device.

In one embodiment, a semiconductor device includes a first transistor including a first source/drain region, and a second transistor stacked on the first transistor. The second transistor includes a second source/drain region. The semiconductor device further includes a via structure disposed between a power element and the second source/drain region. The via structure includes a first via disposed on the power element, and a second via disposed on the first via, wherein the second via is angled with respect to the first via.

In another embodiment, a method of forming a semiconductor device includes forming a first transistor on a substrate, and forming a second transistor on the first transistor. The first transistor includes a first source/drain region, and the second transistor includes a second source/drain region. In the method, a first via is formed on the substrate, and a second via is formed on the first via. The second via is angled with respect to the first via and connects the second source/drain region to the first via. A power element is connected to the first via.

In another embodiment, an integrated circuit includes a field-effect transistor structure including a first field-effect transistor with a first source/drain region, and a second field-effect transistor stacked on the first field-effect transistor. The second field-effect transistor includes a second source/drain region. The field-effect transistor structure further includes a via structure disposed between a power element and the second source/drain region. The via structure includes a first via disposed on the power element, and a second via disposed on the first via, wherein the second via is angled with respect to the first via.

These and other features and advantages of embodiments described herein will become more apparent from the accompanying drawings and the following detailed description.

DETAILED DESCRIPTION

Figures 1A, 1B, 1C:
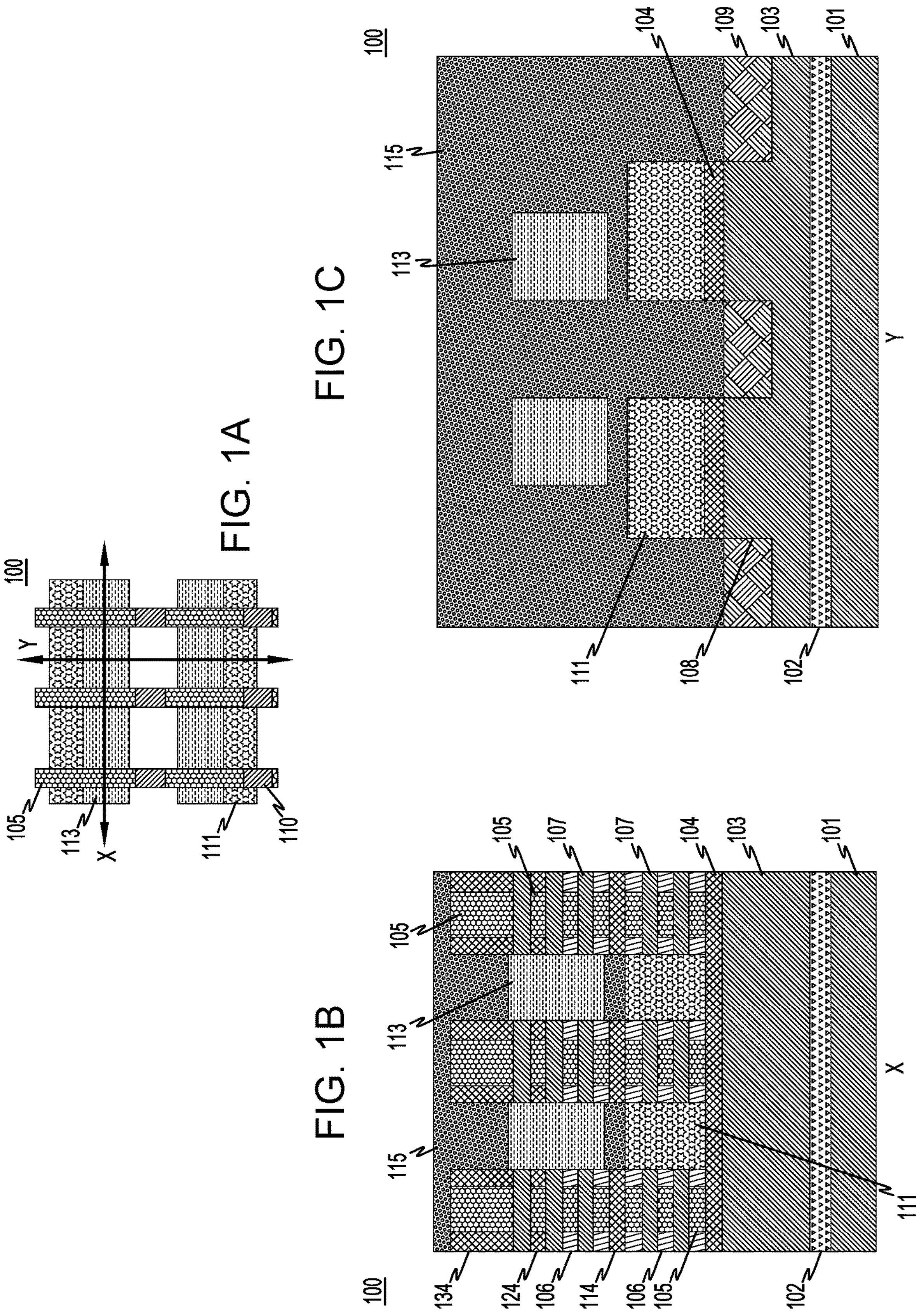
FIG. 1A is a schematic top view of a stacked transistor structure, according to an embodiment of the invention.
FIG. 1B is a schematic cross-sectional view taken along a first axis and illustrating the stacked transistor structure of FIG. 1A, according to an embodiment of the invention.
FIG. 1C is a schematic cross-sectional view taken along a second axis and illustrating the stacked transistor structure of FIG. 1A, according to an embodiment of the invention.

Illustrative embodiments of the invention may be described herein in the context of illustrative methods for forming via to power element structures for stacked transistor devices, where a via structure includes one via in an angled configuration stacked on top of another via in a straight configuration, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers may be used throughout the drawings to denote the same or similar features, elements, or structures, and thus, a detailed explanation of the same or similar features, elements, or structures will not be repeated for each of the drawings. Further, the terms “exemplary” and “illustrative” as used herein mean “serving as an example, instance, or illustration.” Any embodiment or design described herein as “exemplary” or “illustrative” is not to be construed as preferred or advantageous over other embodiments or designs.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves selectively removing sacrificial layers, which may be formed of silicon germanium (SiGe), between sheets of channel material, which may be formed of silicon (Si).

For continued scaling (e.g., to 2.5 nm and beyond), next-generation complementary FET (CFET) devices may be used. CFET devices provide a complex gate-all-around (GAA) structure. Conventional GAA FETs, such as nanosheet FETs, may stack multiple p-type nanowires or nanosheets on top of each other in one device, and may stack multiple n-type nanowires or nanosheets on top of each other in another device. CFET structures provide improved track height scaling, leading to structural gains (e.g., such as 30-40% structural gains for different types of devices, such as logic devices, static random-access memory (SRAM) devices, etc.). In CFET structures, n-type and p-type nanowires or nanosheets are stacked on each other, eliminating n-to-p separation bottlenecks and reducing the device area footprint. There is, however, a continued to desire for further scaling and reducing the size of FETs.

As discussed above, various techniques may be used to reduce the size of FETs, including through the use of fin-shaped channels in FinFET devices, through the use of stacked nanosheet channels formed over a semiconductor substrate, and next-generation CFET devices.

As used herein, “frontside” refers to a side on top of a semiconductor substrate 101 in the orientation shown in FIGS. 1B-8B. In some instances, the phrase “first side” may be used to refer to a “frontside.”

As used herein, “backside” refers to a side opposite the “frontside” (e.g., a top side of the flipped semiconductor device 100 in FIGS. 9A-12B as opposed to the bottom side in FIGS. 9A-12B). In some instances, the phrase “second side” may be used to refer to a “frontside.”

FIG. 1A is a schematic top view of a semiconductor device 100 having a stacked transistor structure. FIG. 1B is a schematic cross-sectional view taken along a first axis (x-axis), and FIG. 1C is a schematic cross-sectional view taken along a second axis (y-axis) and illustrating the stacked transistor structure of FIG. 1A. Referring to FIGS. 1B and 1C, a semiconductor substrate 101 comprises semiconductor material including, but not limited to, silicon (Si), III-V, II-V compound semiconductor materials or other like semiconductor materials. In addition, multiple layers of the semiconductor materials can be used as the semiconductor material of the semiconductor substrate 101. An etch stop layer 102 is formed on the semiconductor substrate 101, and may comprise, for example, silicon oxide ($SiO_x$) (where x is for example, 2, 1.99 or 2.01), or silicon germanium (SiGe). A semiconductor layer 103 comprising, for example, the same semiconductor material as the semiconductor substrate 101, or other like semiconductor material, is formed on the etch stop layer 102.

In accordance with an embodiment of the present invention, a dielectric layer 104 (also referred to as a bottom dielectric insulator (BDI) layer) is formed on the semiconductor layer 103. The dielectric layer 104 may comprise, for example, silicon nitride (SiN), silicon oxynitride (SiON), silicon-carbon-nitride (SiCN), boron nitride (BN), silicon boron nitride (SiBN), silicoboron carbonitride (SiBCN), silicon oxycarbonitride (SiOCN) and combinations thereof, and is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD).

The stacked transistor structure includes lower nanosheet transistors separated from upper nanosheet transistors by respective dielectric layers 114 (also referred to as middle dielectric insulator (MDI) layers) and portions of an interlayer dielectric (ILD) layer 115. The respective dielectric layers 114 comprise the same or similar material to that of the dielectric layer 104 (e.g., SiN, SiON, SiCN, BN, SiBN, SiBCN, SiOCN and combinations thereof).

The lower nanosheet transistors comprise an alternating structure of gate layers 105 and nanosheet channel layers 107, with bottom source/drain regions 111 extending from the nanosheet channel layers 107. As can be seen, two nanosheet channel layers 107 are alternately stacked with three gate layers 105 in a configuration starting with a lowermost nanosheet channel layer 107 stacked on a lowermost gate layer 105. The upper nanosheet transistors comprise an alternating structure of gate layers 105 and nanosheet channel layers 107, with top source/drain regions 113 extending from the nanosheet channel layers 107. As can be seen, portions of the ILD layer 115 isolate the top and bottom source/drain regions 113 and 111 from each other, and the dielectric layers 114 isolate adjacent gate layers 105 of the upper and lower transistor structures. The number of gate layers 105 and channel layers in a given transistor stack can vary and is not necessarily limited to the illustrated number of gate and nanosheet channel layers 105 and 107. The nanosheet channel layers 107 may be formed of Si or another suitable material (e.g., a material similar to that used for the semiconductor substrate 101). Each of the nanosheet channel layers 107 may have a thickness (in vertical direction in FIG. 1A) in the range of about 4 nm-about 10 nm.

Gate spacers 106, 124 and 134 are positioned on opposite lateral sides of the gate layers 105 of the upper and lower transistors. The gate spacers 106, 124 and 134 are formed on sides of the gate layers 105, and can be formed using deposition techniques such as, for example, CVD, PECVD, RFCVD, PVD, ALD, MBD, PLD, LSMCD, etc. The gate spacers 106, 124 and 134 are formed from material comprising for example, one or more dielectrics, including, but not necessarily limited to, SiN, silicon carbide (SiC), SiON, SiOC, SiCN, BN, SiBN, SiBCN, SiOCN, $SiO_x$, and combinations thereof. The gate spacers 106, 124 and 134 can be formed by any suitable techniques such as deposition followed by directional etching. Deposition may include but is not limited to, ALD or CVD. Directional etching may include but is not limited to, reactive ion etching (RIE). In a non-limiting illustrative embodiment, at least some of the gate spacers (e.g., gate spacers 124 and 134) comprise the same material as the dielectric layers 104 and 114.

The top and bottom source/drain regions 113 and 111 comprise epitaxial layers grown from sides of the nanosheet channel layers 107. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a metal-organic chemical vapor deposition (MOCVD), rapid thermal chemical vapor deposition (RT-CVD), ultra-high vacuum chemical vapor deposition (UHVCVD), or a low pressure chemical vapor deposition (LPCVD) apparatus. A number of different sources may be used for the epitaxial deposition of the in situ doped semiconductor material. In some embodiments, the gas source for the deposition of an epitaxially formed semiconductor material may include silicon (Si) deposited from silane, disilane, trisilane, tetrasilane, hexachlorodisilane, tetrachlorosilane, dichlorosilane, trichlorosilane, and combinations thereof. In other examples, when the semiconductor material includes germanium, a germanium gas source may be selected from the group consisting of germane, digermane, halogermane, dichlorogermane, trichlorogermane, tetrachlorogermane and combinations thereof. The temperature for epitaxial deposition typically ranges from 450° C to 900° C. Although higher temperature typically results in faster deposition, the faster deposition may result in crystal defects and film cracking.

According to a non-limiting embodiment of the present invention, the conditions of the epitaxial growth process for the top and bottom source/drain regions 113 and 111 are, for example, RTCVD epitaxial growth using $SiH_4$, $SiH_2Cl_2$, $GeH_4$, $CH_3SiH_3$, $B_2H_6$, $PF_3$, and/or $H_2$ gases with temperature and pressure range of about 450° C to about 800° C, and about 5 Torr-about 300 Torr. While embodiments of the present invention may be described in connection with source/drain regions for a n-type FET (nFET) comprising, for example, Si source/drain regions, the embodiments are not necessarily limited thereto. The embodiments can also be used in connection with the formation of source/drain regions for p-type FETs (pFETs) comprising, for example, silicon germanium source/drain regions.

The bottom source/drain regions 111 and the top source/drain regions 113, as noted above, may be formed using epitaxial growth processes, and thus may also be referred to as bottom epitaxial layers 111 and top epitaxial layers 113. The bottom source/drain regions 111 and the top source/drain regions 113 may be suitably doped, such as by using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

In non-limiting illustrative embodiments, the top and bottom source/drain regions 113 and 111 can comprise in-situ phosphorous doped (ISPD) silicon or Si:C for n-type devices, or in-situ boron doped (ISBD) silicon germanium for p-type devices, at concentrations of about $1\times10^{19}/cm^3$ to about $3\times10^{21}/cm^3$. By "in-situ," it is meant that the dopant that dictates the conductivity type of the doped layer is introduced during the process step, e.g., epitaxial deposition, which forms the doped layer. The bottom source/drain regions 111 and the top source/drain regions 113 may have a width (in horizontal direction in FIG. 1B) in the range of about 10 nm to about 30 nm.

The gate layers 105 may comprise a gate dielectric layer and a gate conductor layer. The gate dielectric layer may be formed of a high-k dielectric material. Examples of high-k dielectric materials include, but are not limited to, metal oxides such as $HfO_2$ (hafnium oxide), hafnium silicon oxide (Hf-Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer may have a uniform thickness in the range of about 1 nm to about 3 nm.

The gate conductor layer may include a metal gate and/or work function metal (WFM). The WFM for the gate conductor layer may be titanium (Ti), titanium nitride (TiN), tantalum (Ta), tantalum nitride (TaN), aluminum (Al), titanium aluminum (TiAl), titanium aluminum carbon (TiAlC), a combination of Ti and Al alloys, a stack which includes a barrier layer (e.g., of TiN, TaN, etc.) followed by one or more of the aforementioned WFM materials, etc. A metal gate layer including, but not necessarily limited to, metals, such as, for example, tungsten, cobalt, zirconium, ruthenium, copper, metal carbides, metal nitrides, transition metal aluminides, tantalum carbide, titanium carbide, tantalum magnesium carbide, or combinations thereof may be deposited on the WFM layer. It should be appreciated that various other materials may be used for the gate conductor layer as desired.

The ILD layer 115 is formed between the bottom source/drain regions 111 and the top source/drain regions 113, and over the top of the top source/drain regions 113. The ILD layer 115 may be formed of any suitable isolating material, such as $SiO_x$, silicon oxycarbide (SiOC), SiOCN or some other dielectric.

Referring to FIG. 1C, the semiconductor layer 103 comprises a plurality of pedestal portions 108 on which the dielectric (e.g., BDI) layer 104 is formed. A width of the pedestal portions 108 (horizontal direction in FIG. 1C) corresponds to the size of bottom source/drain regions 111 in the same direction. Another dielectric layer 109 fills in recessed portions of the semiconductor layer 103 between the pedestal portions 108. The dielectric layer 109 comprises, for example, an oxide such as, but not necessarily limited to, $SiO_x$ or other suitable dielectric materials. FIG. 1A depicts a simplified top view of the semiconductor device 100, showing the gate layers 105, top source/drain region 113 and bottom source/drain region 111. FIG. 1A further illustrates gate cut portions 110, where spaces between gate layers 105 have been formed to correspond to isolate gate regions from each other.

The schematic cross-sectional views shown in FIGS. 1B, 5A, 7A, 8A, 9A, 10A, 11A and 12A are taken along the x-axis in FIG. 1A, and the schematic cross-sectional views shown in FIGS. 1C, 2-4, 5B, 6, 7B, 8B, 9B, 10B, 11B and 12B are taken along the y-axis in FIG. 1A.

Figure 2:
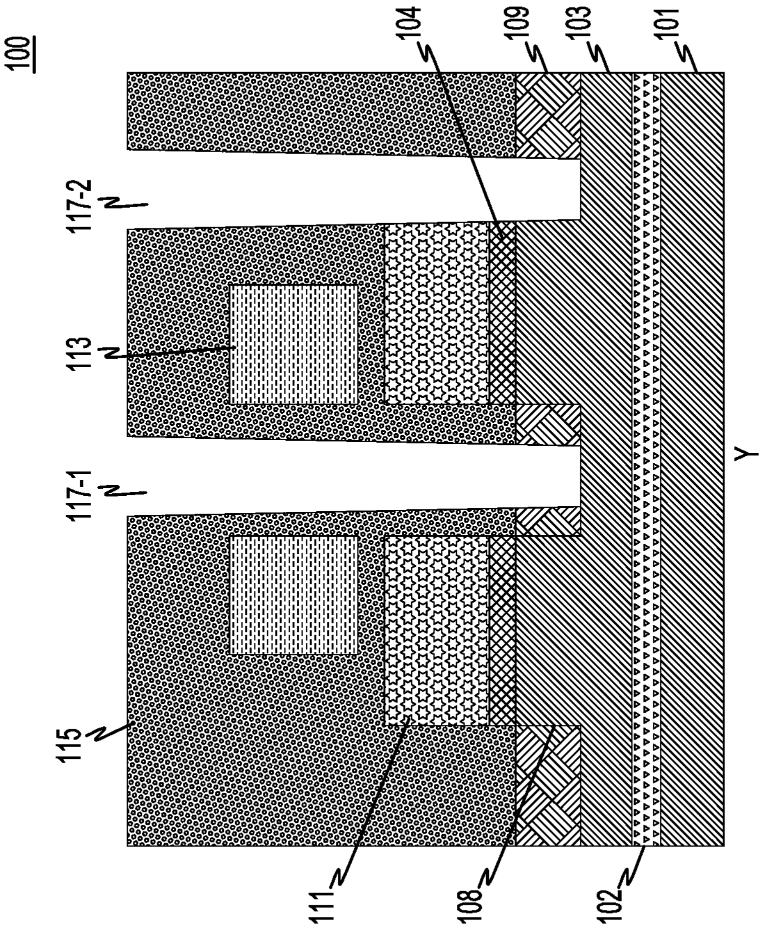
FIG. 2 is a schematic cross-sectional view illustrating formation of via openings in the FIG. 1C structure, according to an embodiment of the invention.

Referring to FIG. 2, via openings 117-1 and 117-2 (collectively via openings 117) are formed through portions of the ILD layer 115 and the dielectric layer 109. The via opening 117-2 exposes a portion of a bottom source/drain region 111 of a transistor, and the via opening 117-1 is formed between two sets of top and bottom source/drain regions 113 and 111 of two transistors. According to an embodiment, masks (not shown) are formed on parts of the ILD layer 115, and exposed portions of the ILD layer 115 and underlying portions of the dielectric layer 109 corresponding to where the via openings 117 are to be formed are removed using, for example, a dry etching process using a RIE or ion beam etch (IBE) process, a wet chemical etch process or a combination of these etching processes. A dry etch may be performed using a plasma. Plasma systems can operate in several modes by adjusting the parameters of the plasma. Ion milling, sputter etching or RIE bombards the wafer with energetic ions of noble gases that approach the wafer approximately from one direction, and therefore, these processes are an anisotropic or a directional etching process. Such wet or dry etch processes include, for example, IBE by Ar/CHF3 based chemistry.

Figure 3:
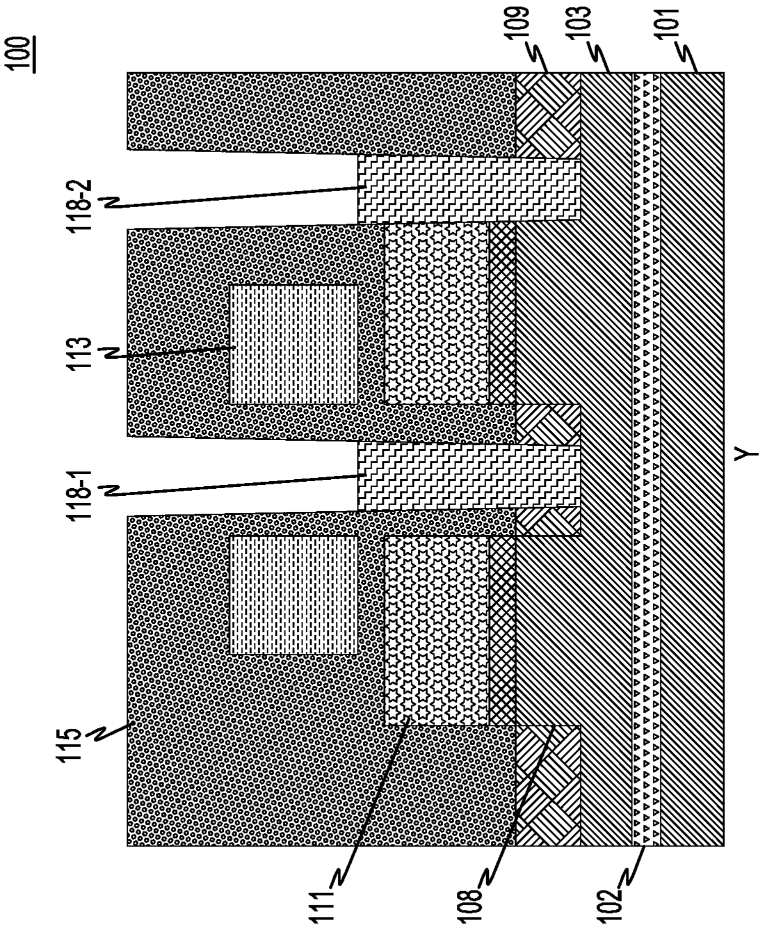
FIG. 3 is a schematic cross-sectional view illustrating metal deposition in the via openings of the FIG. 2 structure, according to an embodiment of the invention.

Referring to FIG. 3, metal layers 118-1 and 118-2 (collectively metal layers 118) are deposited in the via openings 117. According to illustrative embodiments, the metal layers 118 can be deposited near or to a top of each of the openings and then recessed to a lower vertical height as shown in FIG. 3 (e.g., at or near bottom surfaces of the top source/drain regions 113). Alternatively, deposition of the metal layers 118 can be stopped once the metal layers 118 reach the vertical height shown in FIG. 3. The metal layers 118 comprise, for example, a conductor such as, but not necessarily limited to, copper, tungsten, cobalt, ruthenium, etc., and can be deposited using, for example, a deposition technique such as CVD, PECVD, RFCVD, PVD, ALD, MBD, PLD, LSMCD, sputtering and/or plating. If the metal layers 118 require recessing, the embodiments may use wet or dry etch processes to etch the metal layers 118 to the lower vertical height as shown in FIG. 3. Such wet or dry etch processes include, for example, IBE by Ar/CHF3 based chemistry. As can be seen in FIG. 3, the metal layer 118-2 contacts a side surface (e.g., right-side surface) of a bottom source/drain region 111.

Figure 4:
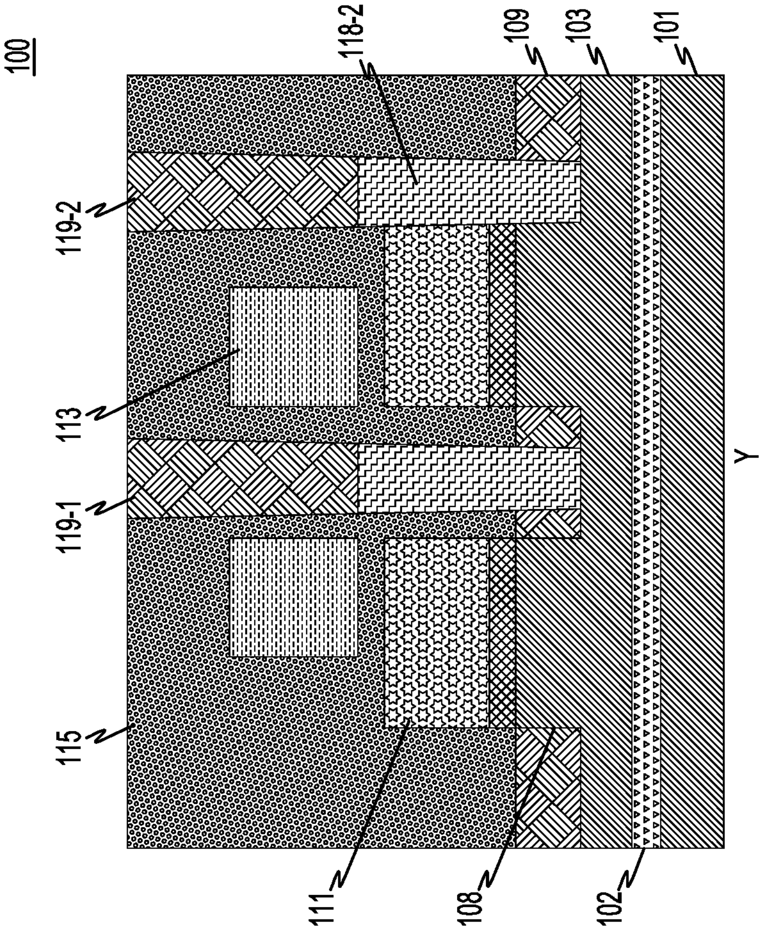
FIG. 4 is a schematic cross-sectional view illustrating dielectric layer deposition in the via openings of the FIG. 3 structure, according to an embodiment of the invention.

Referring to FIG. 4, remaining portions of the via openings 117 are filled with dielectric layers 119-1 and 119-2 (collectively dielectric layers 119) deposited on top of the metal layers 118-1 and 118-2. In illustrative embodiments, the dielectric layers 119 comprise, for example, an oxide such as, but not necessarily limited to, $SiO_x$ or other suitable dielectric material, and are deposited using, for example, a deposition technique such as CVD, PECVD, RFCVD, PVD, ALD, MBD, PLD, or LSMCD followed by a planarization process such as, chemical mechanical planarization (CMP) to remove excess portions of the dielectric material of dielectric layers 119 from on top of the ILD layer 115.

Figure 5B:
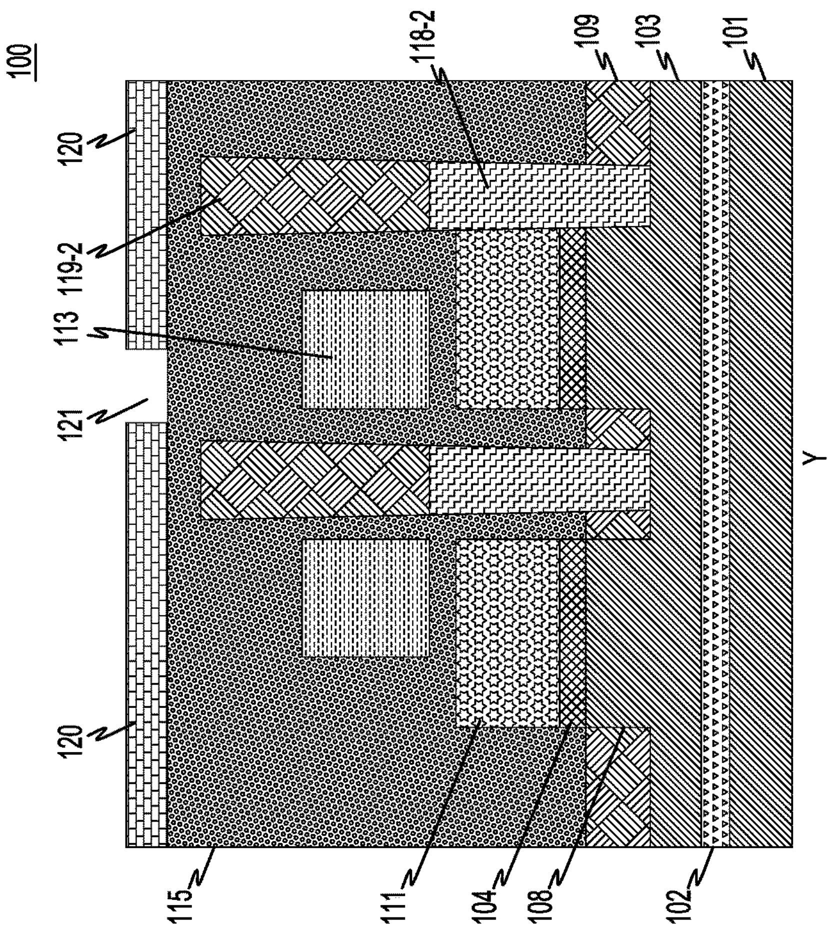
FIG. 5B is a schematic cross-sectional view taken along a second axis and illustrating inter-layer dielectric and hardmask deposition on the FIG. 4 structure, according to an embodiment of the invention.
Figure 5A:
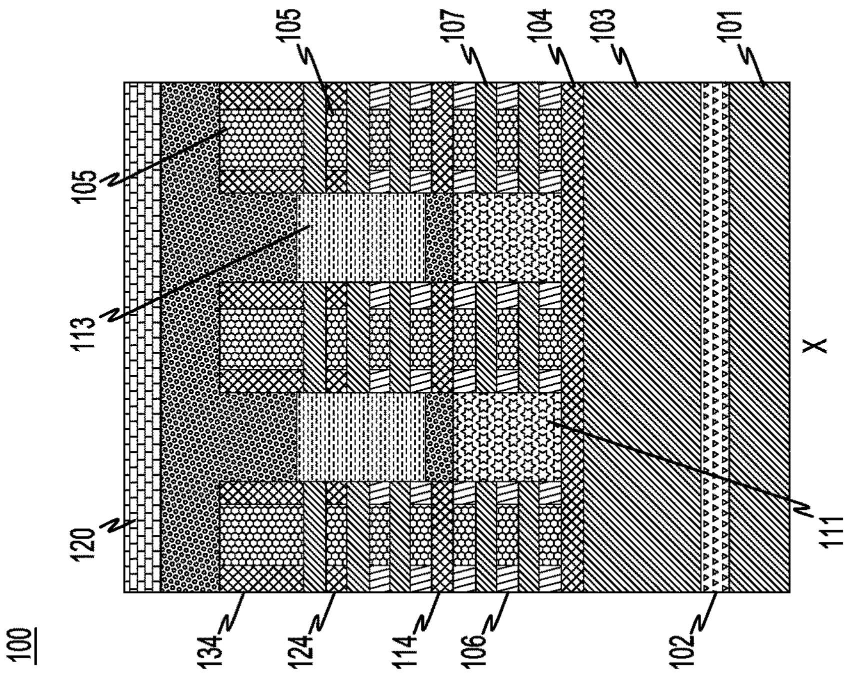
FIG. 5A is a schematic cross-sectional view taken along a first axis and illustrating inter-layer dielectric and hardmask deposition following dielectric layer deposition in the via openings of the FIG. 4 structure, according to an embodiment of the invention.

Referring to FIGS. 5A and 5B, following deposition of the dielectric layers 119, dielectric material is deposited on the resulting structure to increase the height of the ILD layer 115, and a hardmask 120 is deposited on the ILD layer 115 having the increased height. The hardmask 120 comprises, for example, SiN and includes an opening 121 exposing a portion of the ILD layer 115.

Figure 6:
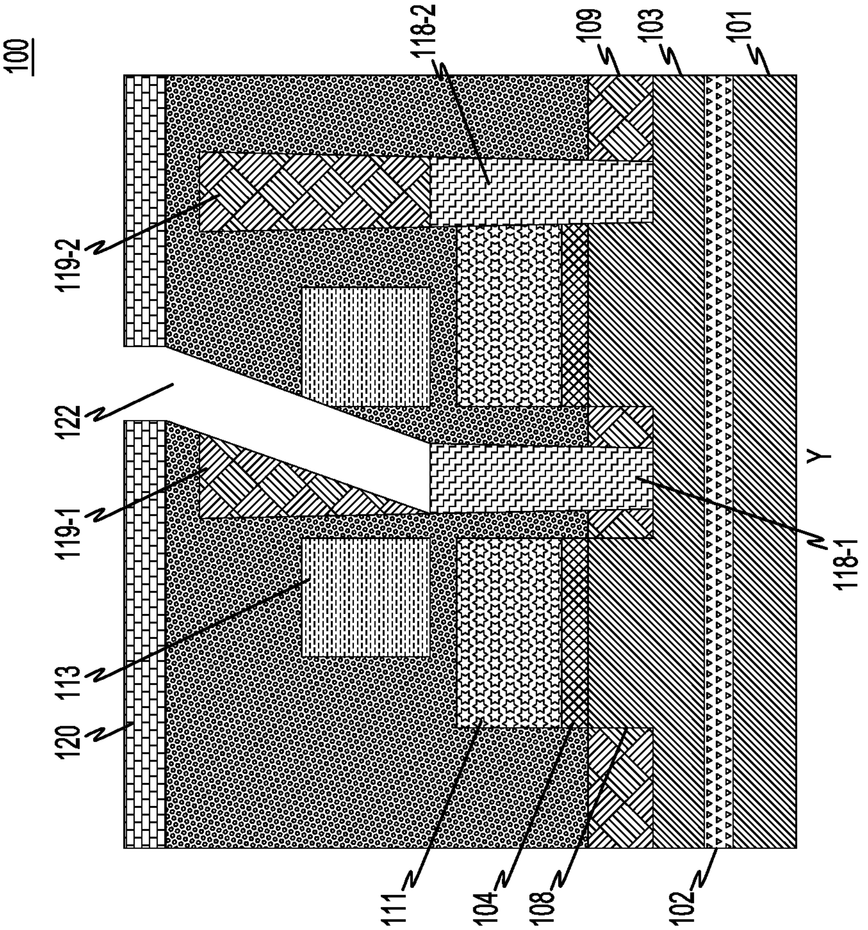
FIG. 6 is a schematic cross-sectional view illustrating formation of an angled via opening in the FIG. 5B structure, according to an embodiment of the invention.

Referring to FIG. 6, an angled via opening 122 is formed by performing an angled etch of the ILD layer 115 and the dielectric layer 119-1. The etchant is introduced through the opening 121 in the hardmask 120. In some embodiments, part of a top source/drain region 113 (right side top source/drain region 113 in FIG. 6) may be removed when forming the angled via opening 122. In illustrative embodiments, a directional angled etch is performed, with etch selectivities the same or similar to those in RIE processes. In illustrative embodiments, the angle at which the angled via opening 122 is formed is controlled by ion optics. In illustrative embodiments, with IBE, a platen angle defines an angle of incidence of the ions. For IBE, a mixture of Ar/CHF3 is used to etch the ILD layer 115 and the dielectric layer 119-1 etch. The angle of the angled via opening 122 can be, for example, >0 to 45 degrees with respect to the top surface of the semiconductor substrate 101 or top surface of the metal layer 118-1).

Figure 7A:
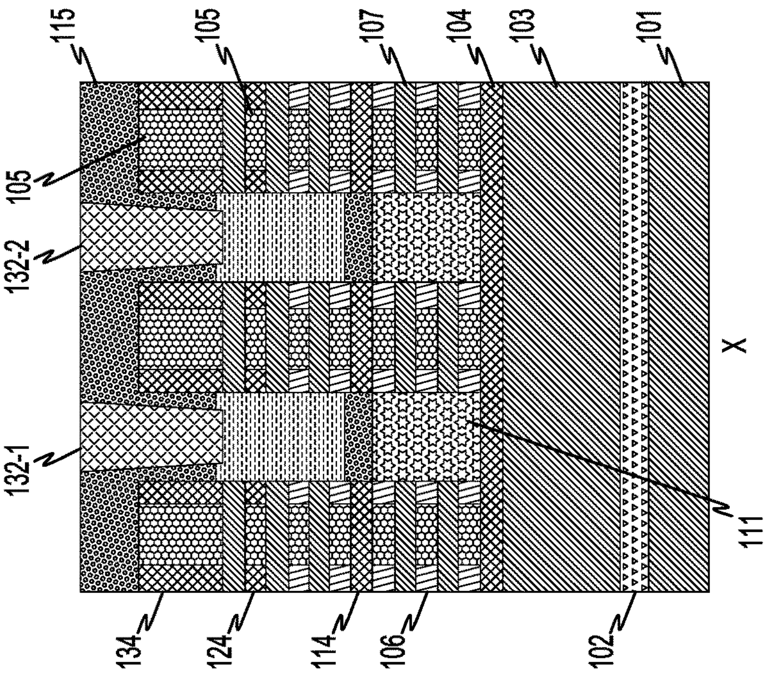
FIG. 7A is a schematic cross-sectional view taken along a first axis and illustrating source/drain contact formation following formation of the angled via opening of the FIG. 6 structure, according to an embodiment of the invention.
Figure 7B:
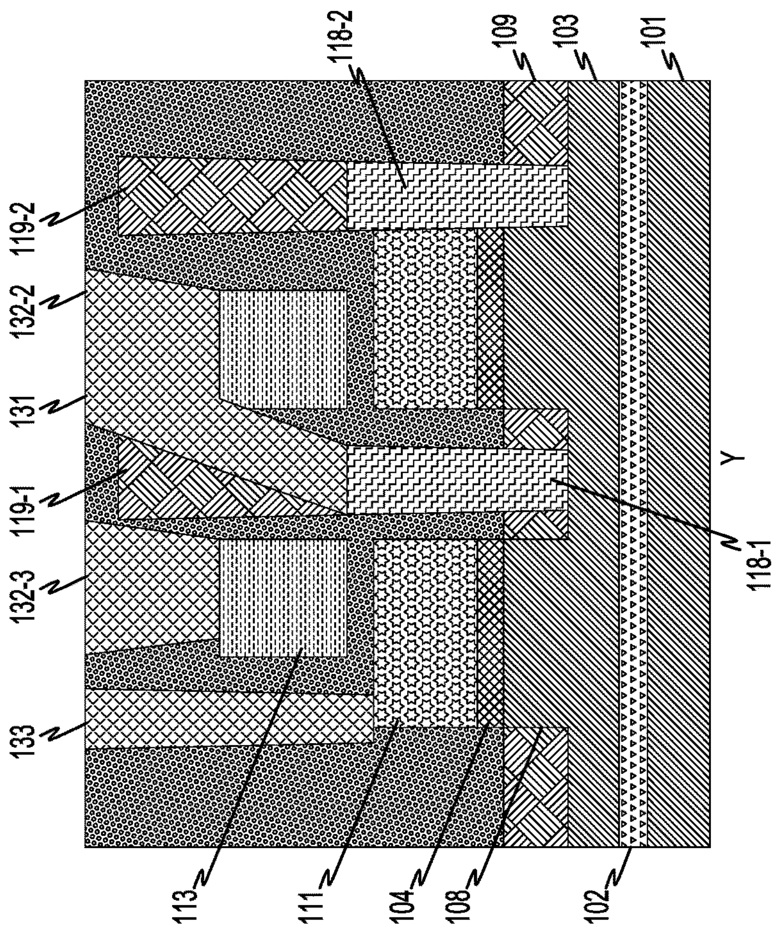
FIG. 7B is a schematic cross-sectional view taken along a second axis and illustrating source/drain contact formation and metal deposition in the angled via opening of the FIG. 6 structure, according to an embodiment of the invention.

Referring to FIGS. 7A and 7B, following formation of the angled via opening 122, top source/drain contacts 132-1, 132-2 and 132-3 (collectively top source/drain contacts 132) and a bottom source/drain contact 133 are formed, and a metal layer 131 is deposited in the angled via opening 122. According to illustrative embodiments, openings corresponding to locations of the top source/drain contacts 132 and the bottom source/drain contact 133 are formed in the ILD layer 115 using, for example, a RIE process. In more detail, portions of the ILD layer 115 exposed via a hardmask (not shown) are etched to form the source/drain contact openings in the ILD layer 115, which are then filled with conductive material (e.g., metal).

The metal layer 131, and the top and bottom source/drain contacts 132 and 133 each comprise, for example, a conductor such as, but not necessarily limited to, copper, tungsten, cobalt, ruthenium, etc., and can be deposited in angled via opening 122 and source/drain contact openings in the ILD layer 115 and other layers using, for example, a deposition technique such as CVD, PECVD, RFCVD, PVD, ALD, MBD, PLD, LSMCD, sputtering and/or plating. Deposition of the metal layer 131, and of the top and bottom source/drain contacts 132 and 133 may be followed by a planarization process (e.g., CMP) which planarizes the top surface of the semiconductor device 100 and removes excess metal material from on top of the ILD layer 115.

Referring to FIG. 7B, the combination of the metal layer 118-1 and the metal layer 131 deposited in the angled via opening 122 forms a via structure including a lower via (metal layer 118-1) and an upper via (e.g., metal layer 131). The metal layer 131 contacts a top source/drain region 113 (e.g., right side top source/drain region 113 in FIG. 7B) at an acute angle with respect to a side (e.g., right side) surface and a top surface of the right side top source/drain region 113. The metal layer 131 also contacts the source/drain contact 132-2 formed on top of and contacting the right side top source/drain region 113 in FIG. 7B. As shown in FIG. 7B, metal layer 131 is angled (e.g., >0 to 45 degrees) with respect a top surface of the semiconductor substrate 101 and the metal layer 118-1. The metal layer 131 extends through the ILD layer 115 and dielectric layer 119-1 to land on and contact the metal layer 118-1. The top source/drain contacts 132 land on and contact top surfaces of their corresponding top source/drain regions 113. The bottom source/drain contact 133 lands on and contacts a top surface of its corresponding bottom source/drain region 111. It is to be understood that the configuration of the top and bottom source/drain contacts 132 and 133 is provided by way of example and may vary depending on design constraints. For example, there may be more or less source/drain contacts than what is shown.

Figure 8B:
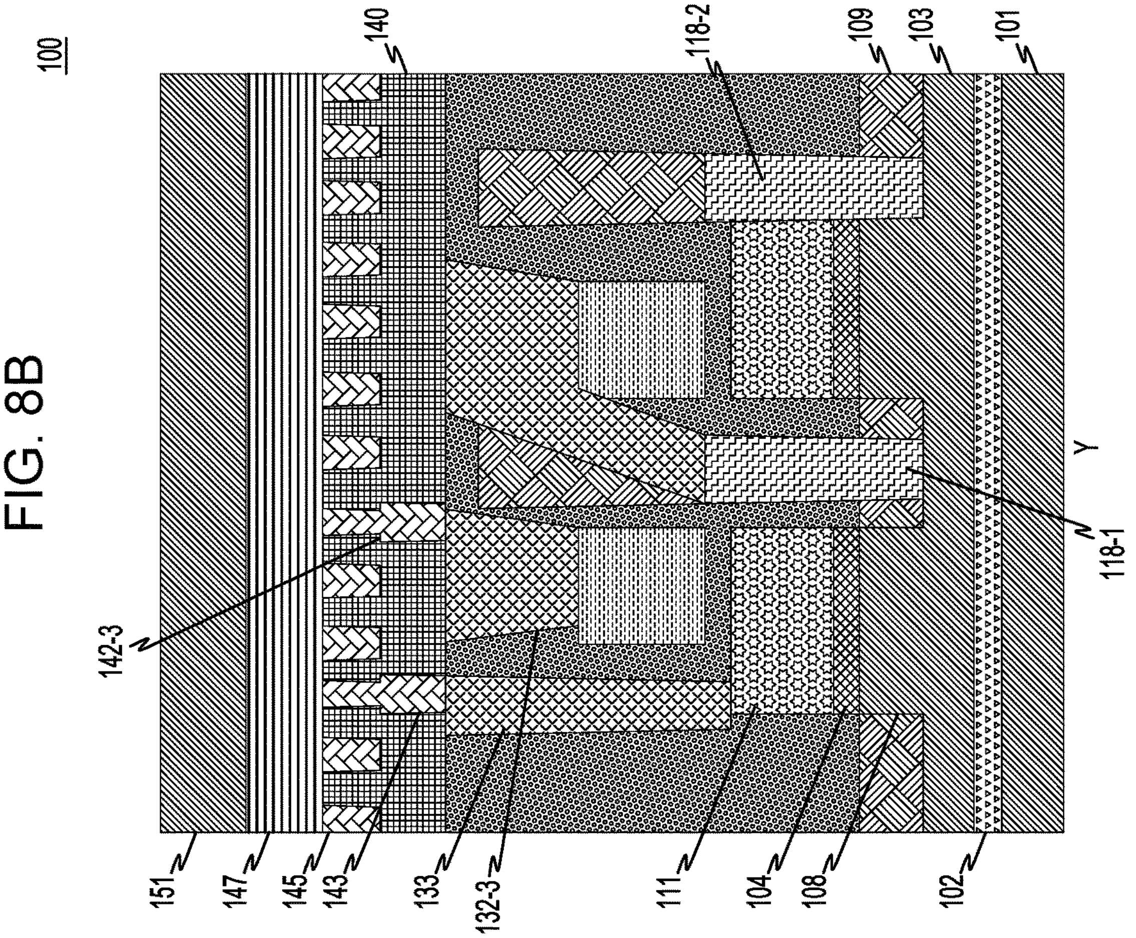
FIG. 8B is a schematic cross-sectional view taken along a second axis and illustrating metallization and backend-of-line (BEOL) layer formation on and carrier wafer bonding to the FIG. 7B structure, according to an embodiment of the invention.
Figure 8A:
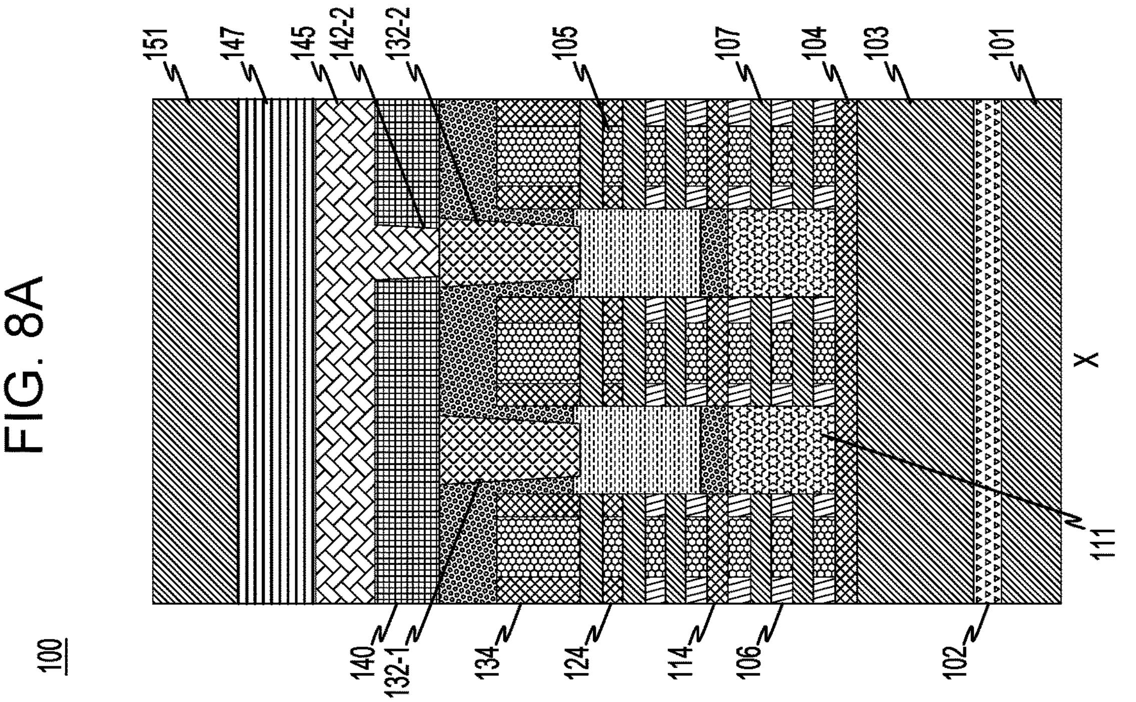
FIG. 8A is a schematic cross-sectional view taken along a first axis and illustrating metallization and backend-of-line (BEOL) layer formation on and carrier wafer bonding to the FIG. 7A structure, according to an embodiment of the invention.

FIGS. 8A and 8B are schematic cross-sectional views illustrating metallization and BEOL layer formation on and carrier wafer bonding to the semiconductor device 100 illustrated in FIGS. 7A and 7B. Middle-of-line (MOL) metallization layers 145 and vias 142-2, 142-3 and 143 to top source/drain contact 132-2, top source/drain contact 132-3 and bottom source/drain contact 133, respectively, are formed in a dielectric layer 140. Frontside BEOL interconnects 147 are formed on the dielectric layer 140 including the MOL metallization layers 145 and vias 142-2, 142-3 and 143. A carrier wafer 151 is bonded to the frontside BEOL interconnects 147. In illustrative embodiments, the dielectric layer 140 may be formed of materials similar to that of the ILD layer 115.

The frontside BEOL interconnects 147 include various BEOL interconnect structures. The carrier wafer 151 may be formed of materials similar to that of the semiconductor substrate 101, and may be formed over the frontside BEOL interconnects 147 using a wafer bonding process, such as dielectric-to-dielectric bonding.

Figure 9B:
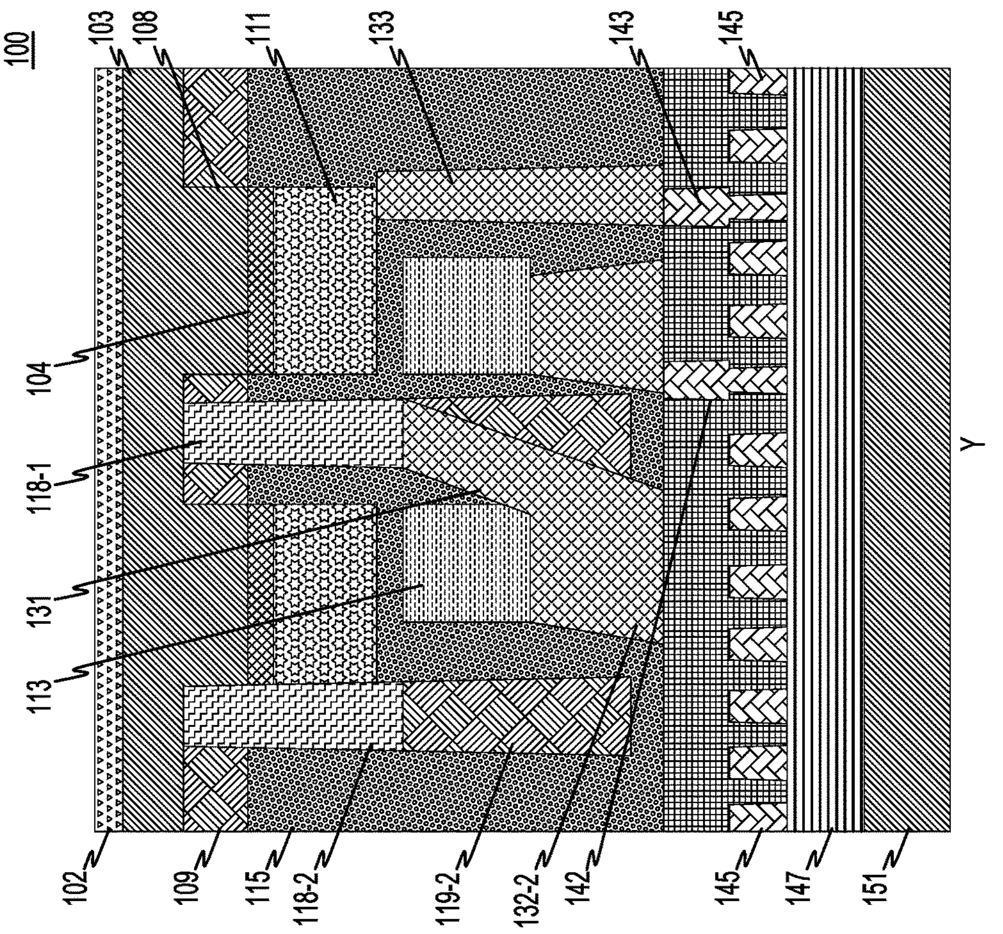
FIG. 9B is a schematic cross-sectional view taken along a second axis and illustrating rotation of and substrate removal from the FIG. 8B structure, according to an embodiment of the invention.
Figure 9A:
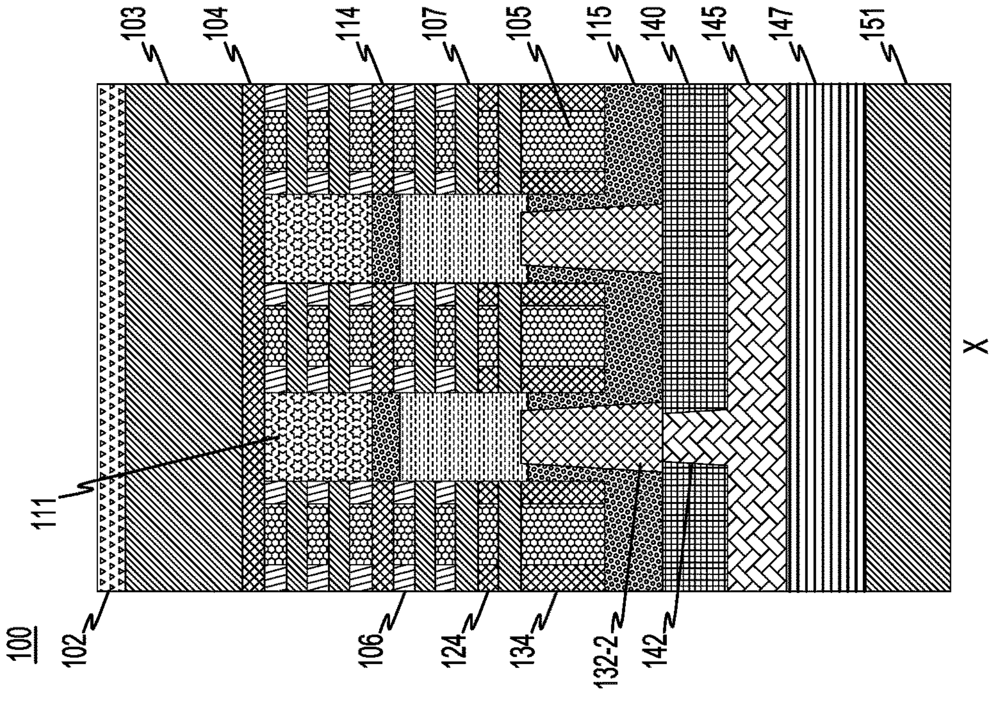
FIG. 9A is a schematic cross-sectional view taken along a first axis and illustrating rotation of and substrate removal from the FIG. 8A structure, according to an embodiment of the invention.

FIGS. 9A and 9B are schematic cross-sectional views illustrating rotation of and substrate removal from the semiconductor device 100 illustrated in FIGS. 8A and 8B. Using the carrier wafer 151, the FIG. 8A and FIG. 8B structures may be "flipped" (e.g., rotated 180 degrees) so that the structures are inverted. In addition, the semiconductor substrate 101 is removed from the back side. The removal process, which comprises etching of the semiconductor substrate 101, stops at the etch stop layer 102 as illustrated in FIGS. 9A and 9B. For example, the semiconductor substrate 101 is selectively etched with an etchant that selectively etches silicon with respect to a material of the etch stop layer 102 (e.g., $SiO_2$ or SiGe).

Figure 10B:
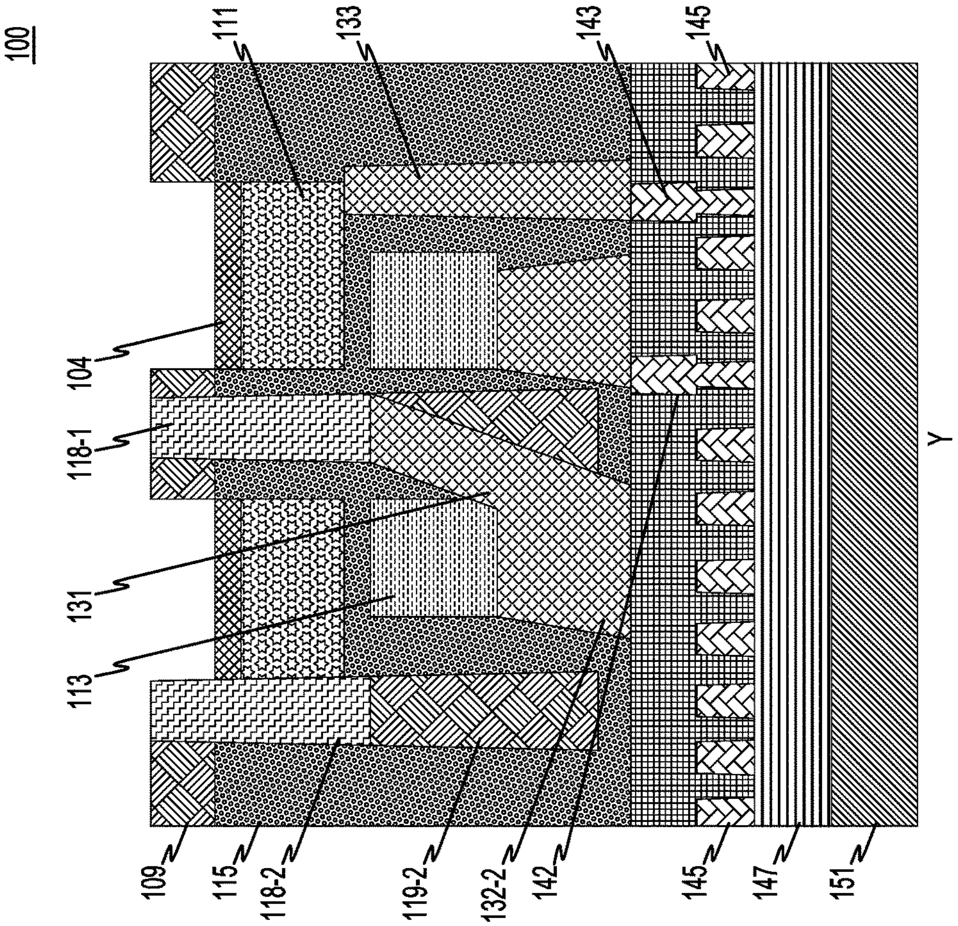
FIG. 10B is a schematic cross-sectional view taken along a second axis and illustrating etch stop layer and selective semiconductor layer removal from the FIG. 9B structure.
Figure 10A:
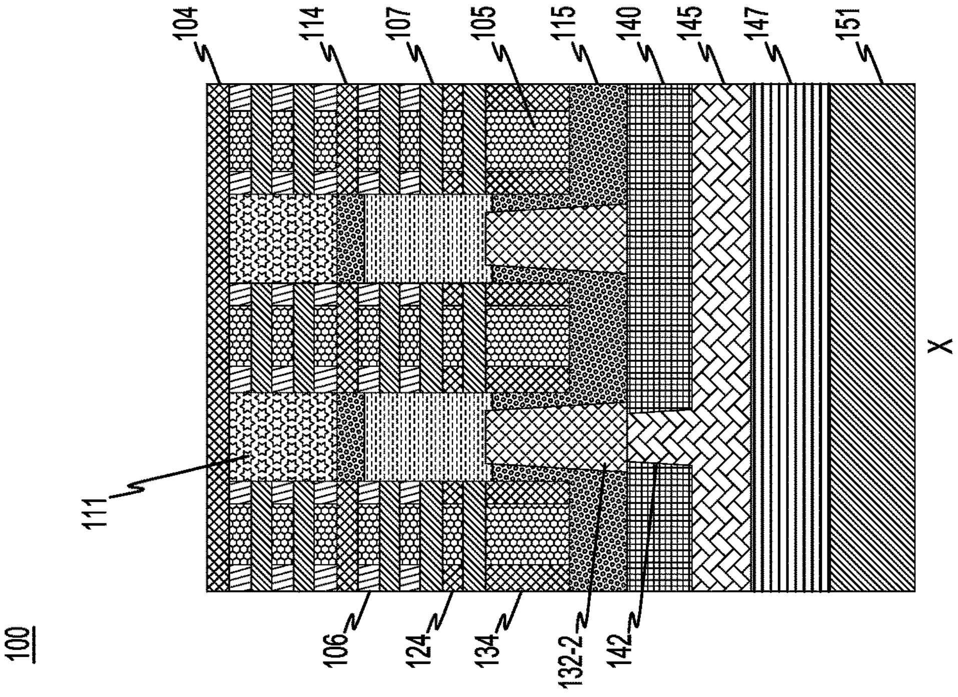
FIG. 10A is a schematic cross-sectional view taken along a first axis and illustrating etch stop layer and selective semiconductor layer removal from the FIG. 9A structure, according to an embodiment of the invention.

FIGS. 10A and 10B are schematic cross-sectional views illustrating removal of the etch stop layer 102 and selective removal of the semiconductor layer 103 from the semiconductor device 100 illustrated in FIG. 9A and FIG. 9B. As shown in FIGS. 10A and 10B, the etch stop layer 102 is removed, followed by removal of the semiconductor layer 103 to expose portions of the dielectric layer 104, the metal layers 118 and the dielectric layer 109. Etching processes for removal of the etch stop layer 102 include, for example, IBE by Ar/CHF3 based chemistry, and etching processes for removal of the semiconductor layer 103 include, for example, IBE by Ar with $SF_6$ or $Cl_2$.

Figure 11B:
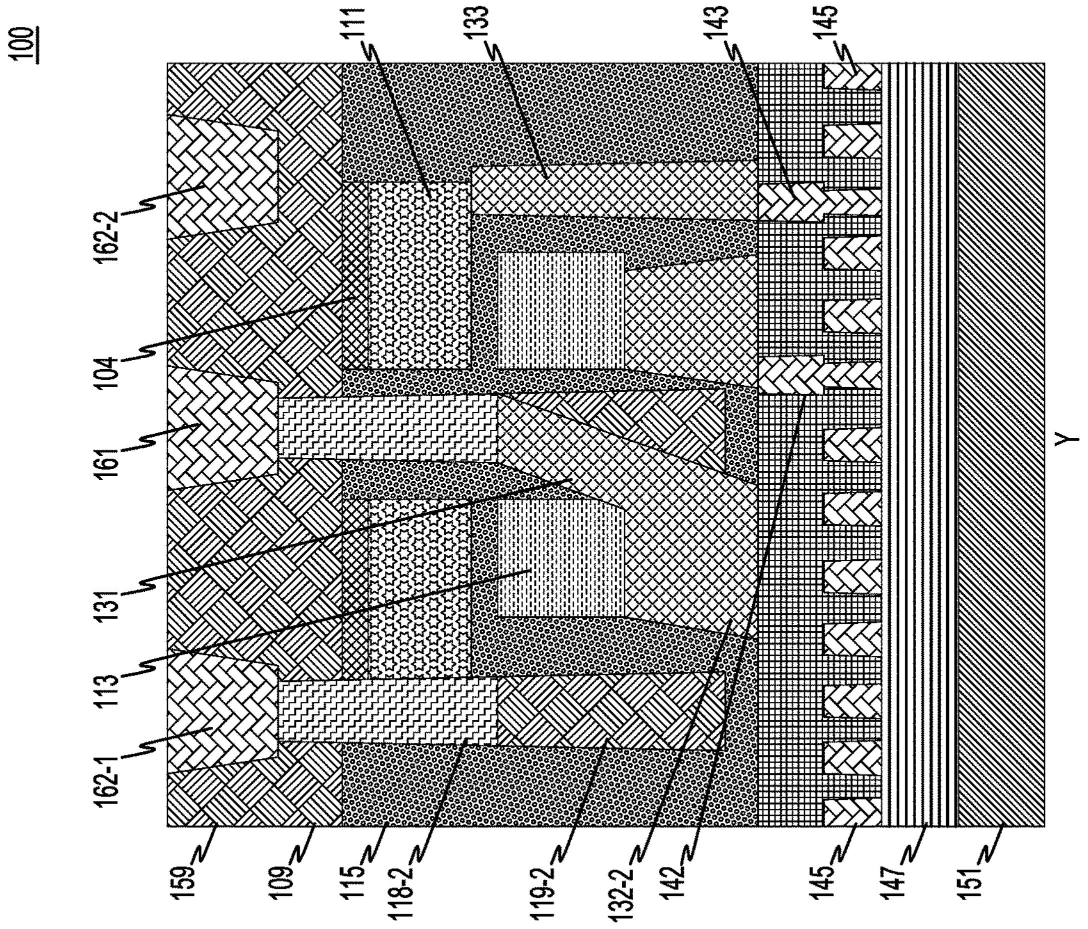
FIG. 11B is a schematic cross-sectional view taken along a second axis and illustrating inter-layer dielectric deposition and power element formation on the FIG. 10B structure, according to an embodiment of the invention.
Figure 11A:
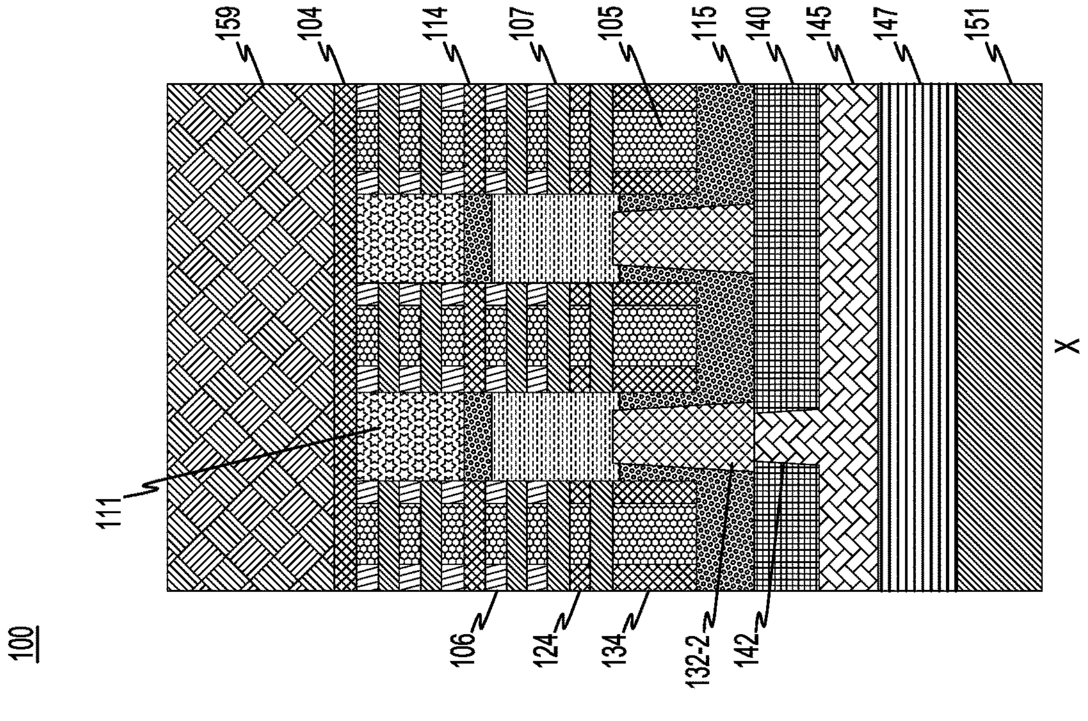
FIG. 11A is a schematic cross-sectional view taken along a first axis and illustrating inter-layer dielectric deposition and power element formation on the FIG. 10A structure, according to an embodiment of the invention.

FIGS. 11A and 11B are schematic cross-sectional views illustrating deposition of a backside ILD layer 159 and formation of backside power rails 161, 162-1 and 162-2 on the semiconductor device 100 illustrated in FIGS. 10A and 10B. The backside power rails 161, 162-1 and 162-2 are also referred to herein as power elements. The backside ILD layer 159 comprises the same or similar material to that of the dielectric layer 109, and is deposited using one or more deposition techniques used for depositing the dielectric layer 109. The backside power rails 161, 162-1 and 162-2 are formed in the backside ILD layer 159 by forming trenches in the backside ILD layer 159 and filling the trenches with conductive material. Trenches are respectively opened in the backside ILD layer 159 using, for example, lithography followed by RIE. The backside power rails 161, 162-1 and 162-2 are formed in the trenches by filling the trenches with conductive material, such as, for example, electrically conductive material including, but not necessarily limited to, tungsten, cobalt, zirconium, tantalum, titanium, aluminum, ruthenium, and/or copper. A liner layer (not shown) including, for example, titanium and/or titanium nitride, may be formed on side and bottom surfaces of the trenches before filling the trenches with the conductive material. Deposition of the conductive material can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

The backside power rail 161 delivers, for example, drain voltage (VDD) through the metal layers 131 and 118-1 to the corresponding top source/drain region 113. The backside power rail 162-1 delivers, for example, source voltage (VSS) through metal layer 118-2 to the corresponding bottom source/drain region 111. Although not shown in FIG. 11B, the backside power rail 162-2 is connected to another source/drain region 111 or 113 to deliver, for example, source voltage (VSS) to a corresponding source/drain region 111 or 113. As can be seen in FIG. 11B, the via structure comprising the metal layer 131 and the metal layer 118-1 contacts the backside power rail 161 through the metal layer 118-1, and the metal layer 118-2 contacts the backside power rail 162.

Figure 12B:
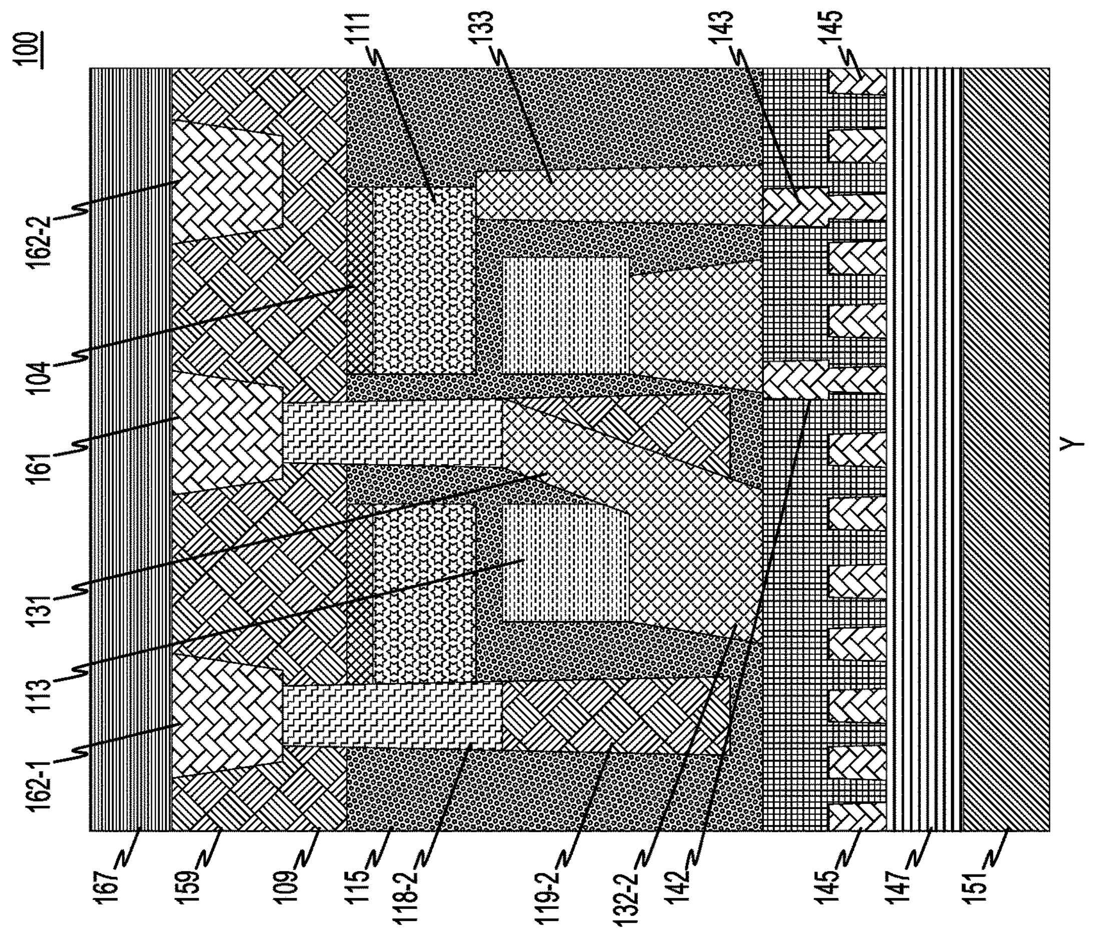
FIG. 12B is a schematic cross-sectional view taken along a second axis and illustrating power delivery network layer formation on the FIG. 11B structure, according to an embodiment of the invention.
Figure 12A:
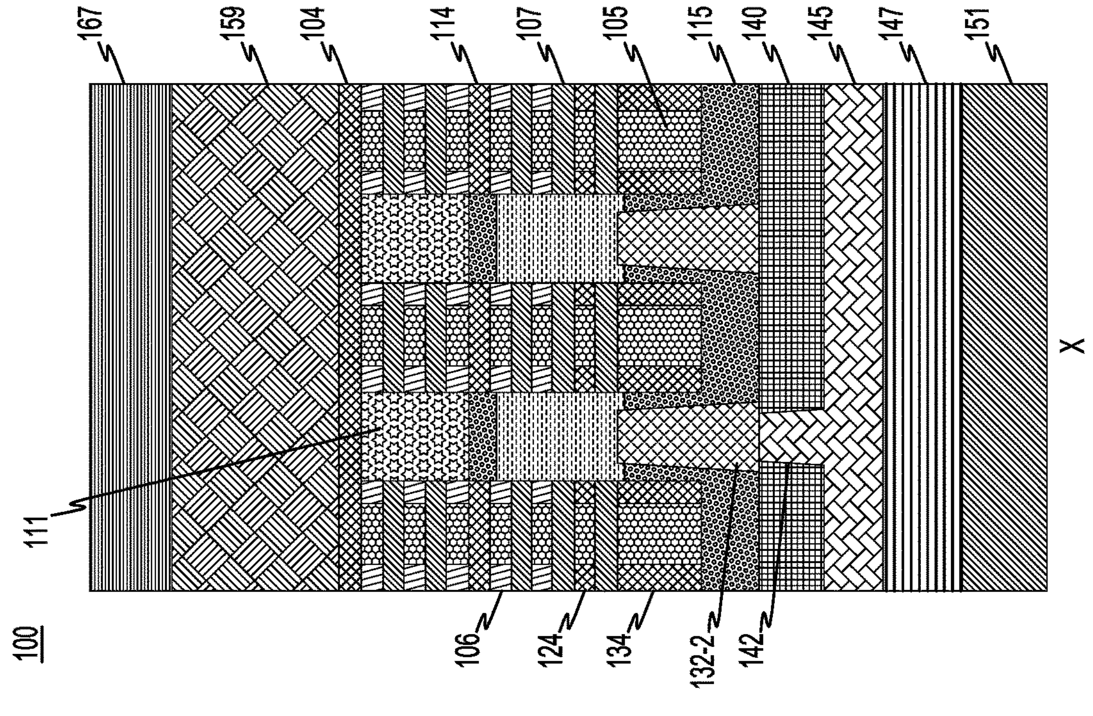
FIG. 12A is a schematic cross-sectional view taken along a first axis and illustrating power delivery network layer formation on the FIG. 11A structure, according to an embodiment of the invention.

FIGS. 12A and 12B are schematic cross-sectional views illustrating formation of backside power delivery network (BSPDN) layers 167 on the semiconductor device 100 illustrated in FIGS. 11A and 11B. The backside power delivery network layers 167 include various BSPDN structures such as, but not necessarily limited to, interconnects in a power supply path from voltage regulator modules (VRMs) to circuits. The interconnects can comprise, for example, power and ground planes in circuit boards, cables, connectors and capacitors associated with a power supply. Backside power delivery prevents BEOL routing congestion, resulting in power performance benefits.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Figure 13:
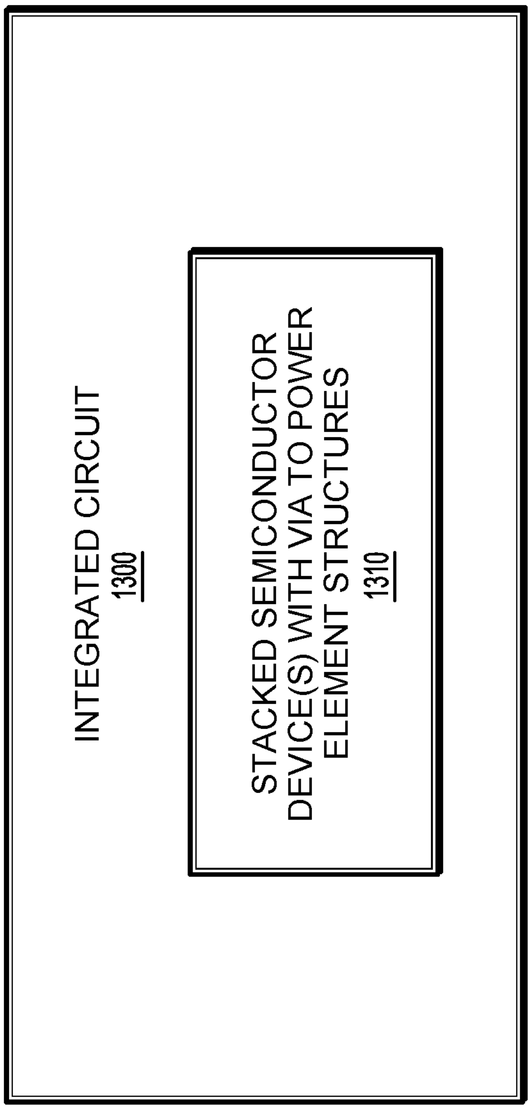
FIG. 13 depicts a block diagram of an integrated circuit comprising one or more stacked semiconductor devices with via to power element structures, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 13 shows an example integrated circuit 1300 which includes one or more stacked semiconductor devices 1310 with the above-described via to power element structures.

As noted above, illustrative embodiments correspond to methods for forming via to backside power element structures for stacked transistor devices, where a via structure includes one via in an angled configuration stacked on top of another via in a straight configuration, along with illustrative apparatus, systems and devices formed using such methods. The angled configuration of the one via in the illustrative embodiments allows for increased distance between a source/drain power delivery via of a first transistor and a source/drain contact of a second transistor, while using the same spacing or decreased spacing between transistors when compared with conventional structures. As a result, shorts or other device failures between transistors can be prevented while maintaining the same or smaller footprints.

In addition, when compared with conventional structures, the angled configuration of the one via in the illustrative embodiments permits a larger contact area between the one via and the other via of the via structure while maintaining the increased distance between the source/drain power delivery via of the first transistor and the source/drain contact of a second transistor. Also, when compared with conventional structures, the angled configuration of the one via in the illustrative embodiments avoids shorts between source/drain regions of the same transistor while maintaining the increased distance between the source/drain power delivery via of the first transistor and the source/drain contact of a second transistor.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:

a first transistor comprising a first source/drain region;

a second transistor stacked on the first transistor and comprising a second source/drain region; and a via structure disposed between a power element and the second source/drain region, wherein the via structure comprises:

a first via having a surface disposed on the power element, the first via having first sidewalls; and a second via disposed on another surface of the first via, the second via having second sidewalls respectively extending from the first sidewalls, wherein the second sidewalls of the second via extend at an angle with respect to the first sidewalls of the first via, and further wherein the second sidewalls include a first sidewall and a second sidewall opposing the first sidewall, the first sidewall and the second sidewall having different lengths extending between the first via and the second source/drain region, and the first sidewall and the second sidewall physically contacting corresponding ones of the first sidewalls.

2. The semiconductor device of claim 1, wherein the power element comprises a power rail.

3. The semiconductor device of claim 1, further comprising an additional via disposed between an additional power element and the first source/drain region.

4. The semiconductor device of claim 3, wherein the additional via is spaced apart from the via structure and contacts a side surface of the first source/drain region.

5. The semiconductor device of claim 1, wherein the second via contacts the second source/drain region at an acute angle with respect to at least one surface of the second source/drain region.

6. The semiconductor device of claim 1, wherein the second via is angled with respect to a wafer on which the first and second transistors are disposed.

7. The semiconductor device of claim 1, wherein the first and second transistors each comprise a plurality of gate structures alternately stacked with a plurality of channel layers.

8. The semiconductor device of claim 7, wherein the first source/drain region is connected to the plurality of channel layers corresponding to the first transistor, and the second source/drain region is connected to the plurality of channel layers corresponding to the second transistor.

9. The semiconductor device of claim 7, wherein the first source/drain region is disposed on a lateral side of the plurality of gate structures and the plurality of channel layers corresponding to the first transistor, and the second source/drain region is disposed on a lateral side of the plurality of gate structures and the plurality of channel layers corresponding to the second transistor.

10. An integrated circuit comprising:

a field-effect transistor structure comprising:

a first field-effect transistor comprising a first source/drain region;

a second field-effect transistor stacked on the first field-effect transistor and comprising a second source/drain region; and a via structure disposed between a power element and the second source/drain region, wherein the via structure comprises:

a first via having a surface disposed on the power element, the first via having first sidewalls; and a second via disposed on another surface of the first via, the second via having second sidewalls respectively extending from the first sidewalls, wherein the second sidewalls of the second via extend at an angle with respect to the first sidewalls of the first via, and further wherein the second sidewalls include a first sidewall and a second sidewall opposing the first sidewall, and the first sidewall and the second sidewall having different lengths extending between the first via and the second source/drain region, and the first sidewall and the second sidewall physically contacting corresponding ones of the first sidewalls.

11. The integrated circuit of claim 10, wherein the power element comprises a power rail.

12. The integrated circuit of claim 10, further comprising an additional via disposed between an additional power element and the first source/drain region.

13. The integrated circuit of claim 12, wherein the additional via is spaced apart from the via structure and contacts a side surface of the first source/drain region.

14. The integrated circuit of claim 10, wherein the second via contacts the second source/drain region at an acute angle with respect to at least one surface of the second source/drain region.

15. The integrated circuit of claim 10, wherein the second via is angled with respect to a wafer on which the first and second field-effect transistors are disposed.

16. The integrated circuit of claim 10, wherein the first and second field-effect transistors each comprise a plurality of gate structures alternately stacked with a plurality of channel layers.

17. The integrated circuit of claim 16, wherein the first source/drain region is connected to the plurality of channel layers corresponding to the first field-effect transistor.

18. The integrated circuit of claim 16, wherein the second source/drain region is connected to the plurality of channel layers corresponding to the second field-effect transistor.

19. The integrated circuit of claim 16, wherein the first source/drain region is disposed on a lateral side of the plurality of gate structures and the plurality of channel layers corresponding to the first field-effect transistor.

20. The integrated circuit of claim 16, wherein the second source/drain region is disposed on a lateral side of the plurality of gate structures and the plurality of channel layers corresponding to the second field-effect transistor.

* * * * *